United States Patent [19]

Wilcox

[11] 3,824,494

[45] July 16, 1974

[54] TEMPERATURE STABLE RELAXATION OSCILLATOR HAVING CONTROLLABLE OUTPUT FREQUENCY

[75] Inventor: Milton E. Wilcox, Tempe, Ariz.

[73] Assignee: Motorola, Inc., Chicago, Ill.

[22] Filed: June 8, 1973

[21] Appl. No.: 368,381

[52] U.S. Cl. ..................... 331/111, 331/20, 331/34, 331/108 D, 331/177 R

[51] Int. Cl. .............................................. H03b 5/24

[58] Field of Search ............ 331/111, 20, 34, 177 R, 331/143, 108 D

[56] References Cited

UNITED STATES PATENTS

| | | | |
|---|---|---|---|
| 3,364,441 | 1/1968 | Rogers | 331/111 |
| 3,432,772 | 3/1969 | Johnsen et al. | 331/11 |
| 3,688,220 | 8/1972 | Gay | 331/111 |
| 3,748,591 | 7/1973 | Visioli, Jr. et al. | 331/111 X |

*Primary Examiner*—Herman Karl Saalbach
*Assistant Examiner*—Siegfried H. Grimm
*Attorney, Agent, or Firm*—Vincent J. Rauner; Maurice J. Jones

[57] ABSTRACT

The disclosed oscillator configuration is suitable for being provided in monolithic integrated circuit form and provides a sawtooth output signal having a repetition rate which is controllable and which is substantially independent of temperature variation. The oscillator circuit includes a comparator which senses the voltage across a discrete timing capacitor and switches states to control the charge and discharge of the capacitor. The oscillator configuration insures that no conductive semiconductor devices are connected to the timing capacitor during the relatively long charge time of the capacitor and that all transistors connected to the capacitor during the short discharge time are saturated to minimize the effects of the thermal changes of the active devices on the capacitor charge and discharge times. Moreover, the oscillator circuit requires only two power supply levels and one timing control terminal to facilitate its use in minimum lead integrated circuit packages including other circuits.

16 Claims, 3 Drawing Figures

TEMPERATURE STABLE RELAXATION OSCILLATOR HAVING CONTROLLABLE OUTPUT FREQUENCY

RELATED PATENTS AND PATENT APPLICATIONS

The subject matter of the present application is related to the subject matter of a patent application entitled "Monolithic Horizontal Processing Circuit With Selectable Duty Cycle" filed June 24, 1972 in the name of the present inventor, and bears Ser. No. 256,523 and of U.S. Pat. No. 3,688,220 entitled "Stable Differential Relaxation Oscillator" which was filed in the name of Michael J. Gay on June 1, 1971 and issued on Aug. 29, 1972, both of which are assigned to the assignee of the present application.

BACKGROUND OF THE INVENTION

Relaxation oscillators which generally rely on resistive-capacitive (R-C) frequency determining networks are utilized in many applications including television sweep oscillators, timing circuits and decoders for stereophonic FM radio receivers. In some of these applications, it is desirable for the frequency of the oscillator output signal to be stable with power supply voltage variations and temperature changes but that the frequency be variable in response to a control signal. More specifically, it is desirable for relaxation oscillators utilized in the horizontal sections of television receivers and the decoder section of stereophonic receivers to be compatible with monolithic phase detectors which require that a predetermined voltage and impedance level be maintained at the output terminal thereof by the oscillator. Such phase detectors supply a control signal for synchronizing the oscillator output signal with a received timing signal.

Some prior art relaxation oscillator circuits while being adequate for many applications have disadvantages associated with them when utilized in monolithic phase lock loop systems, for instance. Some such prior art oscillators require that three potential levels be applied to them for optimum operation. Since only a two potential supply is often readily available, it is necessary that the monolithic structure including such oscillators include further active and passive components which create the third supply potential. These extra components take up die area, heat up the chip and fail. The extra components decrease both the yield and reliability of the circuit. Moreover, some prior art relaxation oscillators tend to undesirably cause the oscillating frequency or repetition rate to vary with temperature. Relaxation oscillators utilized in television horizontal sweep circuits generally provide a sawtooth output wave comprised of an exponential beam scan portion extending away from a reference axis in a first direction which has a relatively long time duration as compared to an exponential beam return portion which extends in the other direction toward the reference axis. Some prior art configurations render a transistor having its base connected to the R-C timing network conductive to produce the relatively long scan portion of the sawtooth. Since the base current drawn by the transistor tends to vary with temperature, the amount of charging current conducted away from the capacitor by the conductive transistor also varies with temperature. As a result, the repetition rate of the oscillator output signal is undesirably temperature dependent. Moreover, some prior art configurations also render transistors which are connected to the timing capacitor conductive during the retrace portion which also detrimentally causes the sawtooth frequency to vary with temperature change.

Some applications require that an integrated relaxation oscillator be included in a monolithic chip along with several other circuits. More specifically, an integrated circuit used in the horizontal drive circuitry of television receiver might include a phase detector, a relaxation oscillator and a predriver, as disclosed in the aforementioned related patent application. The cost and size of a packaged chip increases as the number of required chip leads increase. Since it is desired to keep package cost and size to a minimum, it is desirable that the integrated relaxation oscillator have only one frequency control terminal to which required external, discrete frequency determining components can be connected. Common types of stable multivibrators are not suitable for these applications because they require two terminals between which frequency control components are connected in addition to the power supply terminals. Also, some prior art relaxation oscillator configurations are too complex to be economically fabricated in monolithic form.

SUMMARY OF THE INVENTION

Accordingly, it is an object of this invention to provide an improved oscillator circuit.

Another object of this invention is to provide an improved oscillator circuit providing an output signal having a repetition rate which is substantially independent of variations in ambient temperature.

Still another object of the invention is to provide an oscillator circuit having an output signal with a frequency which is substantially independent of variations in supply voltage.

A further object of the invention is to provide a relaxation oscillator circuit which has an uncomplicated configuration suitable for being fabricated in monolithic integrated circuit form.

A still further object of the invention is to provide a monolithic integrated relaxation oscillator which is compatible with integrated phase detector circuits requiring a predetermined direct current output voltage at the output terminal thereof by the oscillator.

An additional object of the invention is to provide an integratable oscillator circuit having only one frequency control terminal in addition to power supply terminals.

The relaxation oscillator circuit of the invention includes a frequency determining circuit having a charge circuit connected in series with a timing capacitor. A first control terminal of a comparator is connected to the junction between the charge circuit and the capacitor, and a second control terminal of the comparator is connected to the output terminal of a switchable threshold determining circuit. The output terminal of the comparator is connected to the control terminals of the switchable threshold determining circuit and of a normally nonconductive discharge circuit, which is connected between the timing capacitor and a reference potential conductor.

At the beginning of a cycle of operation, the switchable threshold determining circuit applies a high threshold voltage to the second control terminal fo the differential amplifier which causes the active devices of the differential amplifier connected to the timing capacitor to remain in a nonconductive condition. Consequently, the comparator provides a first control signal which causes the active devices of the discharge circuit to also remain in a nonconductive condition. The charge circuit conducts current into the capacitor which charges to provide an output voltage portion of increasing magnitude. When the magnitude of the output voltage reaches the magnitude of the high threshold determining voltage applied to the second control electrode of the comparator, the comparator circuit switches to another state of operation and applies a second control signal at its output terminal. The threshold determining circuit provides a low threshold determining voltage to the second control electrode of the comparator and the discharge circuit is rendered conductive in response to the second control signal. Since the discharge circuit has less resistance than the charge circuit, the timing capacitor rapidly discharges until its voltage magnitude equals the magnitude of the low threshold determining voltage. The comparator then changes back to its initial state of operation and again applies the first control signal which renders the discharge circuit nonconductive and causes the threshold determining circuit to again provide the higher threshold determining voltage and renders the discharge circuit nonconductive. The oscillator circuit requires only a two level power supply and has only one frequency determining terminal in addition to the power supply terminals. Since all the active devices connected to the timing capacitor are nonconductive during the charge cycle which is most of the cycle of operation, the changes in electrical characteristics of these devices with temperature do not deleteriously affect the frequency of oscillation. Moreover, the conductive active devices connected to the timing capacitor during the discharge portion of the cycle are saturated to minimize the changes of their electrical characteristics with temperature. The resulting circuit configuration is relatively uncomplicated as compared to some prior art relaxation oscillator configurations and is suitable for being provided in monolithic form. The frequency of the output signal of the oscillator can be controlled by an external current applied to the capacitor to facilitate the use of the oscillator in monolithic phase lock loops including phase detectors requiring the oscillator to provide a predetermined D.C. voltage to the output terminal of the phase detector.

DETAILED DESCRIPTION OF THE PREFERRED EMBODIMENT

Figure 1:
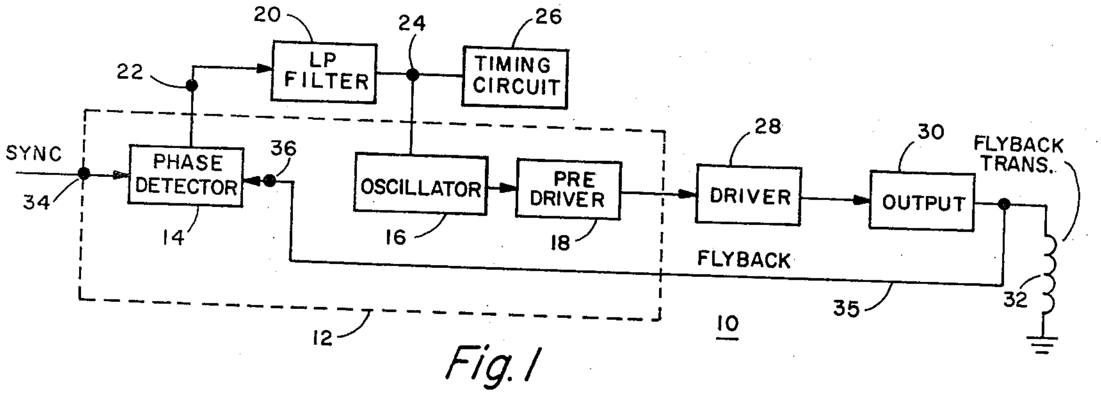
FIG. 1 is a block diagram of the circuitry of a monolithic horizontal system for a television receiver which includes a relaxation oscillator of one embodiment of the invention.

Referring now to the drawings, a horizontal control system 10 for a television receiver is shown in FIG. 1. Phase detector 14, oscillator 16, and predriver 18, which are enclosed within dash line 12, are capable of being fabricated in monolithic integrated circuit form. Low pass filter 20 is connected between the phase detector output terminal 22 and oscillator control terminal 24. Timing circuit 26 is likewise connected to oscillator control terminal 24. Low pass filter 20 and timing circuit 26 are comprised of discrete components which may have values that are not suitable for being provided in a monolithic structure and which are stable with temperature change. Driver circuit 28 and output circuit 30 are connected from the output terminal of predriver 18 to fly back transformer 32. Input terminal 34 of phase detector 14 is connected to receive demodulated horizontal synchronizing signals. Fly back transformer 32 is connected to input terminal 36 of phase detector 14 by conductor 35 so that the phase of a portion of the fly back pulse can be compared with the phase of the horizontal synchronizing signal.

In operation, the timing of the sawtooth output signal of horizontal relaxation oscillator 16 is synchronized or phase locked to the horizontal sync pulses by a control signal generated by phase detector 14. More specifically, sync pulses obtained from the composite video signal by a sync separator (not shown) are coupled to first input 34 of phase detector 14. A portion of the fly back pulse is coupled to second input terminal 36 of phase detector 14. An appropriate direct current (D.C.) output control signal is generated by phase comparator 14 in response to the phase difference, if any, between the applied sync and fly back pulses. The D.C. control current is passed through low pass filter 20 to oscillator control terminal 24 to adjust the phase of the periodic output signal of the oscillator. The configuration of phase detector 14 requires that a quiescent D.C. level of a predetermined magnitude be developed at phase detector output terminal 22 by oscillator 16.

Figure 2:
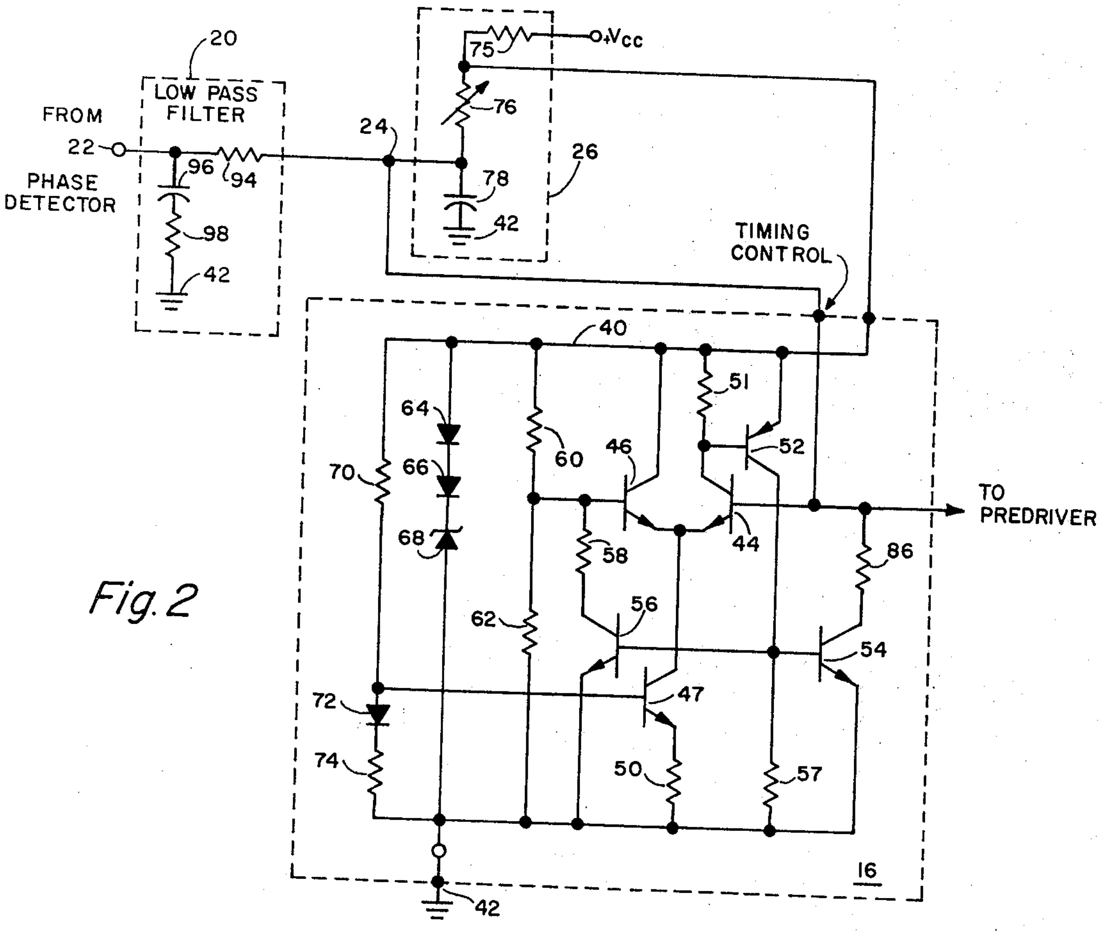
FIG. 2 is a schematic diagram of a relaxation oscillator of one embodiment of the invention.

FIG. 2 is a schematic diagram of oscillator 16, low pass filter 20 and timing circuit 26 which are depicted in block form in FIG. 1. Positive power supply conductor 40 is adapted to receive and apply a supply D.C. potential of a first positive magnitude and ground or reference conductor 42 is adapted to receive and apply a supply potential of a more negative magnitude. Conductors 40 and 42 each include a strip of metalization provided on the die in a known manner. Oscillator 16 includes a pair of differentially connected switchable transistors 44 and 46. Current source transistor 47 includes a collector electrode which is connected to the emitter electrodes of transistors 44 and 46 and an emitter electrode which is connected through resistor 50 to the reference terminal. The collector of transistor 46 is directly connected to positive power supply voltage conductor 40, and the collector of transistor 44 is connected through resistor 51 to conductor 40 and to the base of PNP "turn around" transistor 52. The emitter of transistor 52 is connected directly to conductor 40. Transistors 44, 46, 47 and 52 in cooperation with resistors 50 and 51 form a comparator having a single ended output at the collector of transistor 52 and input terminals at the bases of transistors 44 and 46.

The collector of "turn around" transistor 52 is connected to the base electrode of timing capacitor discharge transistor 54 and to the base electrode of threshold voltage switch transistor 56. The collector of capacitor discharge transistor 54 is connected to timing control input terminal 24 and the emitter is connected to ground conductor 42. Turn off resistor 57 connects the base electrodes of transistors 56 and 54 to the ground conductor to provide a junction capacitance discharge path that facilitates rapid turn off of these transistors. Resistor 58 is connected between the collector of threshold switch transistor 56 and the base electrode of differential switch transistor 46. Resistors 57 and 86 cooperate with transistor 54 to form the capacitor discharge circuit.

A voltage divider comprised of series resistors 60 and 62 is connected between conductor 40 and conductor 42. The node between the resistors is connected to the base electrode of transistor 46. The values of resistors 60 and 62 are selected to provide a selected portion of the total power supply voltage to the base of transistor 46 for establishing a higher threshold voltage, $V_{TH}$, which also approximates the maximum excursion of the magnitude of the output sawtooth signal. Resistors 58, 60 and 62 cooperate with transistor 56 to form a switchable threshold determining circuit.

Diodes 64 and 66 and zener diode 68 are connected in series between conductors 40 and 42 to clamp the magnitude of the power supply voltage between conductors 40 and 42 to a virtually constant level in a substantially known manner. The temperature coefficients of the voltage drops of diodes 64 and 66 are selected to counterbalance the temperature coefficient of the voltage developed by zener diode 68 so that the voltage across terminals 40 and 42 remains the constant with termperature change. Resistor 70 is connected between the base electrode of current source transistor 47 and conductor 40 and diode 72 and resistor 74 are connected in series between the base electrode of transistor 47 and ground conductor 42. Diode 72 and resistor 74 provide a substantially constant base-to-emitter voltage to current source transistor 47 so that a constant amount of current is conducted thereby from either or both of transistors 44 and 46. Resistor 75, which may be a discrete component, provides a conductive path between oscillator 16 and the positive supply and limits the magnitude of the current applied to the voltage regulator comprised of diodes 64, 66 and 68. Generally, if the base voltage of transistor 44 is more positive than the base voltage of transistor 46, transistor 44 is rendered conductive and transistor 46 is rendered nonconductive so that transistor 44 conducts the total current set by current source transistor 47.

Timing control resistor 76, which may be a variable, has one terminal connected to conductor 40 and a second terminal connected both to timing control terminal 24 and to a first plate of timing control capacitor 78. The second or other plate of timing control capacitor 78 is connected to the ground or reference conductor 42. Resistor 76 forms part of the charging circuit for capacitor 78.

Figure 3:
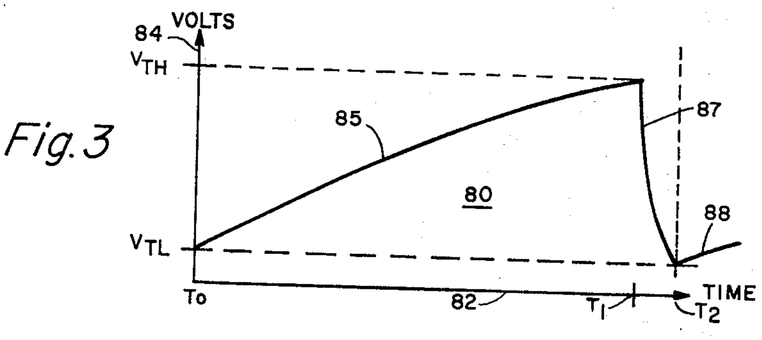
FIG. 3 shows one cycle of the recurring sawtooth waveform developed at the output terminal of the oscillator of FIG. 2.

The free-running mode of operation for oscillator 16 is next explained and then the frequency controlled mode is explained. Oscillator 16 controls the charge and discharge of timing control capacitor 78 to form a recurring signal comprised of a plurality of waveforms at terminal 24 such as sawtooth waveform 80, indicated in FIG. 3. Abscissa axis 82 of FIG. 3 indicates time and ordinate axis 84 indicates the instantaneous voltage magnitude developed across discrete timing capacitor 78 during one cycle of operation. At time $T_0$ capacitor 78 begins being charged by a current conducted through timing resistor 76 to form sweep portion 85 of waveform 80, which has a positive slope. Also, at time $T_0$, differential switch transistor 46 is conductive or "on" and transistor 44 is nonconductive or "off." Transistor 46 is rendered conductive by the high threshold voltage, $V_{TH}$, developed at the base thereof by the resistive divider comprised of resistors 60 and 62. Transistor 44 is nonconductive because its base voltage is less positive than the voltage at the base of transistor 46. Since transistor 44 is nonconductive, the voltage at the collector thereof approaches the magnitude of the positive supply voltage applied to conductor 40. Hence, transistor 52 is nonconductive and does not conduct sufficient base current to either capacitor discharge transistor 54 or threshold switch transistor 56 to render them conductive. The negative voltage at the collector of transistor 52 forms a first control voltage which assures that discharge transistor 54 is nonconductive between time $T_0$ and $T_1$. Therefore, the regulated positive supply voltage applied to conductor 40 charges timing control capacitor 78 until time $T_1$ when the voltage at timing control terminal 24 and the base of differential switch transistor 44, becomes slightly greater than the high threshold voltage, $V_{TH}$, applied to the base of transistor 46.

At time $T_1$, differential switch transistor 44 is rendered conductive in response to the magnitude of voltage across timing control capacitor 78 exceeding the magnitude of the voltage at the base of differential switch transistor 46. As a result, between times $T_1$ and $T_2$ differential switch transistor 44 conducts the current demanded by current source transistor 47 and differential switch transistor 46 is nonconductive. As transistor 44 is rendered conductive, its collector voltage drops to render transistor 52 conductive. The collector current and positive collector voltage applied by transistor 52 forms a second control signal which supplies base currents for capacitor discharge transistor 54 and threshold switch transistor 56 to also render them conductive. Conductive threshold switch transistor 56 in effect connects resistor 58 in parallel with resistor 62. Consequently, the resistance from the base of transistor 46 to the reference potential conductor is lowered to thereby lower the threshold determining voltage developed at the base of transistor 46 to a lower magnitude designated as $V_{TL}$ in FIG. 3.

Also, beginning at time $T_1$ in response to the second control voltage, capacitor discharge transistor 54 completes the conductive path from timing control capacitor 78 through resistor 86 to ground. Since discharge resistor 86 has a smaller value of, for instance, 430 ohms, than charge resistor 76, of for instance 10,000 ohms, capacitor 78 is discharged much more rapidly than it is charged so the voltage thereof decays in an exponential manner, as indicated by portion 87 of waveform 80 in FIG. 3. The magnitude of the voltage of capacitor 78 drops until time $T_2$ when it falls slightly below the lower threshold voltage $V_{TL}$ developed at the base of transistor 46. Consequently, at time $T_2$ transistor 46 is rendered conductive and transistor 44 is rendered nonconductive to begin a subsequent cycle as indicated by portion 88 of waveform 80 in FIG. 3. Since at time $T_2$, transistor 44 is again rendered nonconductive, it again provides the first control signal which renders transistors 52, 54 and 56 nonconductive. As a result, resistor 58 is disconnected from being in parallel with resistor 62 and the higher threshold setting voltage, $V_{TH}$, is again applied to the base of transistor 46.

The oscillator free running frequency is thus set by the values of the discrete R-C circuit comprised of capacitor 78 and resistor 76. Proper choice of resistor 76 and capacitor 78 gives oscillator 16 a wide range of frequencies of operation. Many combinations of values of resistor 76 and capacitor 78 will satisfy the free running frequency requirement of 15.734 kilohertz for the horizontal oscillator of a T.V. receiver. The oscillator frequency is largely independent of the slight supply voltage variations not eliminated by diodes 64, 66 and 68, since the capacitor charge current and the high and low threshold setting voltages all follow supply voltage variation. Moreover, oscillator circuit 16 requires a power supply providing only positive and ground potentials rather than three potentials as required by some prior art oscillator circuits. This advantage is effectuated by referencing capacitor discharge transistor 54 and threshold switching transistor 56 to ground rather than to another positive supply level.

It is important that the free running frequency of oscillator 16 not vary as the temperature of the monolithic chip containing it varies. It is well-known that the electrical characteristics of transistors and diffused resistors vary with temperature. For instance, the base-to-emitter voltage necessary to cause a bipolar transistor to draw a given base or collector current tends to decrease as the temperature increases. Between times $T_0$ and $T_1$ which represents on the order of 95 percent of the total period of the sawtooth shown in FIG. 3, all transistors directly connected capacitor 78 are nonconductive. Thus, the variations of the electrical parameters of these transistors with temperature have inconsequential effects on the charging of capacitor 78. Although, conductive transistor 54 is connected to capacitor 78 during the discharge portion between times $T_1$ and $T_2$, transistor 54 is driven into saturation so that its parameter variations with temperature have insignificant effect on the frequency. Also, transistor 56 is driven into saturation so that it does not undesirably effect the magnitude of the lower threshold voltage.

Another temperature effect relates to charge storage in saturated transistors 54 and 56. More specifically, at time $T_2$ when the discharge ramp reaches voltage $V_{TL}$, transistor 44 is rendered nonconductive but transistors 52, 54 and 56 are not rendered nonconductive instantaneously therewith because of charge stored in their junction capacitances. Hence, the discharge ramp extends on down after time $T_2$ for a small time duration. The amount of this duration varies as a function of temperature because the storage times of transistors 54 and 56 tend to go up with temperature to increase the time constant of the transistors with increase in temperature. Turn off resistors 51 and 57 tend to minimize this affect by draining the charge stored within these transistors at time $T_2$. Hence, the frequency or repetition rate of the sawtooth generated by oscillator 16 tends to remain more constant with temperature variation than the frequencies of R-C oscillators having conductive transistors connected to the timing capacitors thereof during the majority of each period. The frequency of operation of oscillator 16 varies as the log of ratios of resistors 58, 60 and 62. Thus, if these resistors are fabricated so that their ratios remain constant with temperature change they will cause virtually no change in frequency as their temperature vary. The frequency of oscillation also depends directly on the charge and discharge time constants defined by the values of resistors 76 and 86 and capacitor 78. Diffused resistor 86 may contribute a slight negative frequency temperature coefficient which is minimized by shortening the timing capacitor discharge time, which is the period between times $T_1$ and $T_2$ of FIG. 3.

The frequency of oscillator 16 is controlled by coupling a control current generated by phase detector 14, through low pass filter 20 either into or away from timing control capacitor 78. For instance, if the frequency must be increased to provide loop lock then current is added to capacitor 78 and if the frequency must be decreased then current is drawn from the capacitor by the phase detector. Low pass filter 20 includes resistor 94, which is connected from filter input terminal 22 to timing control terminal 24 and capacitor 96 and resistor 98 which are connected in series from input terminal 22 to ground conductor 42. Resistor 94 provides a path for the control currents flowing between phase detector 14 and oscillator timing capacitor 78 and defines the impedance at the output of the phase detector. Moreover, resistors 94 and 98 and capacitor 96 integrate the oscillator output sawtooth waveform provided at terminal 24 to develop a D.C. level at terminal 22 which is required to keep active devices in phase detector 14 within their active operating regions. Also, by making the resistance of resistor 94 a large value, the current flowing from terminal 24 to the phase detector will change the voltage at the output of the phase detector enough to cause the phase detector to saturate to thereby limit the hold-in frequency range of the system. This is necessary in television receiver applications to prevent wide frequency extremes which might damage output power devices.

Below is a list of component values for oscillator circuit 16 which have been successfully provided in monolithic form to provide a high quality integrated circuit structure:

| Components | Values |
|---|---|
| Resistor 50 | 470.0 ohms |
| Resistor 51 | 3.3 kilohms |
| Resistor 57 | 2.4 kilohms |
| Resistor 58 | 1.2 kilohms |
| Resistor 62 | 3.6 kilohms |
| Resistor 74 | 240.0 ohms |
| Resistor 70 | 3.8 kilohms |
| Resistor 60 | 2.4 kilohms |
| Resistor 86 | 430.0 ohms |

Timing capacitor 78 and resistor 76 which are discrete components located off of the integrated circuit chip may respectively have values of 0.01 microfarads and 10 kilohms. The above values are given for purposes of illustration and not by way of limiting the invention.

I claim:

1. An oscillator circuit including in combination:

first conductive means for applying a direct current potential of a first magnitude;

second conductive means for applying a direct current potential of a second magnitude;

capacitive means having a first electrode connected to said second conductive means, and a second electrode;

charge circuit means coupling said second electrode of said capacitive means to said first conductive means;

comparator means having a first control terminal connected to said second electrode of said capacitive means, a second control terminal adapted to receive a threshold determining voltage, and an output terminal, said comparator means providing a control signal at said output terminal thereof in response to the magnitude of the voltage across said capacitive means reaching a predetermined level;

switchable threshold determining circuit having a first electron control means with a control terminal connected to said output terminal of said comparator means and an output terminal coupled to said second control terminal of said comparator means, said switchable threshold determining circuit switching the threshold determining voltage of said comparator from a high value to a low value in response to said control signal applied thereto by said comparator; and discharge circuit means having a second electron control means with a first terminal coupled to said second electrode of said capacitive means, a second terminal connected to said second conductive means, and a control terminal connected to said output terminal of said comparator means and to said control terminal of said first electron control means, said discharge circuit means being responsive to said control signal to discharge said capacitive means.

2. The oscillator circuit of claim 1 wherein said charge circuit means includes a resistive means.

3. The oscillator circuit of claim 1 wherein said second electron control means includes a transistor means which is saturated by said control signal.

4. The oscillator circuit of claim 1 wherein said switchable threshold determining circuit means includes:

first resistive means connected from said first conductive means to said second control electrode of said comparator means;

second resistive means connected from said second control electrode of said comparator means to said second conductive means;

third resistive means having one terminal connected to said second control electrode of said comparator means and a second terminal; and said first electron control means includes a threshold voltage switching transistor means having a first electrode connected to said second conductive means, a second electrode connected to said second terminal of said third resistive means, and a control electrode connected to said output terminal of said comparator means.

5. The oscillator circuit of claim 1 wherein said comparator means includes:

first differentially connected electron control means having a control electrode forming said second control electrode of said comparator means, a second electrode connected to said first conductive means and a first electrode;

second differentially connected electron control means having a second electrode, a first electrode connected to said first electrode of said first differentially connected electron control means and a control electrode forming said first control electrode of said comparator means and;

third electron control means having a control electrode connected to said second electrode of said second differentially connected electron control means, a first electrode connected to said first conductive means, and a second electrode forming said output terminal of said comparator means.

6. The oscillator circuit of claim 5 further including current source means connected from said first electrodes of said first and second differentially connected electron control means to said second conductive means.

7. The oscillator circuit of claim 6 wherein said differentially connected electron control means and said current source means include bipolar transistors of a first conductivity type having emitter, base and collector electrodes respectively corresponding to said first, control and second electrodes and said third electron control means includes a bipolar transistor of a second conductivity type.

8. The oscillator circuit of claim 1 further including voltage regulator means connected between said first conductive means and second conductive means.

9. The oscillator circuit of claim 8 wherein said voltage regulator means includes a zener diode means.

10. The oscillator circuit of claim 1 further including adjustable current control means connected to said second electrode of said capacitive means for varying the frequency of oscillation of said oscillator.

11. A temperature stable monolithic, relaxation oscillator circuit for use with an external power supply having only a first potential terminal and a second potential terminal, an external frequency control circuit having a capacitor, and a charging circuit coupled to the capacitor, such monolithic relaxation oscillator circuit including in combination:

differential amplifier means having a first control electrode adapted to be connected to the capacitor, a second control electrode adapted to receive a threshold determining voltage, and an output electrode, said differential amplifier means being structured to provide a first control signal at said output electrode thereof in response to the voltage across the capacitor falling below a first voltage magnitude at said second control electrode and being structured to provide a second control signal in response to the voltage across the capacitor rising above a second voltage magnitude at said second control electrode;

discharge circuit means having a first electron control means with a first electrode adapted to be connected to the second potential terminal, a control electrode connected to said output electrode of said differential amplifier means, and a second electrode adapted to be coupled to the capacitor, said first electron control means being structured to be rendered nonconductive in response to said first control signal and conductive in response to said second control signal; and threshold determining circuit means having a second electron control means with a control electrode connected to said output electrode of said differential amplifier means and to said control electrode of said first electron control means, a first electrode adapted to be coupled to the second potential terminal and a second electrode coupled to said second control electrode of said differential amplifier means, said second electron control means being structured to be rendered nonconductive in response to said first control signal to apply said voltage of a second magnitude that is greater than said first magnitude to said second control electrode, said first electron control means tending to isolate the capacitor from temperature induced changes in said threshold determining circuit means and said second electron control means tending to isolate said second control electrode of said differential amplifier means from temperature induced changes in said discharge circuit means so that the repetition rate of the output signal of the oscillator tends to remain constant with temperature change.

12. The oscillator circuit of claim 11 wherein said first electron control means includes a transistor means which is saturated by said second control signal.

13. The oscillator circuit of claim 11 wherein said threshold determining circuit means includes:

first monolithic resistive means adapted to be connected from the first potential terminal to said second control electrode of said differential amplifier means;

second monolithic resistive means having one terminal connected to said second control electrode of said differential amplifier means and a second terminal adapted to be connected to the second potential terminal;

third monolithic resistive means having one terminal connected to said second control electrode of said differential amplifier means and a second terminal; and monolithic threshold voltage switching transistor means having a first electrode adapted to be connected to the second potential terminal, a second electrode connected to said second terminal of said third resistive means, and a control electrode connected to said output terminal of said differential amplifier means.

14. The oscillator circuit of claim 11 wherein said differential amplifier means includes:

first differentially connected electron control means having a control electrode forming said second control electrode of said differential amplifier means, a second electrode adapted to be connected to the first potential terminal and a first electrode;

second differentially connected electron control means having a second electrode coupled to said output terminal of said differential amplifier means, a first electrode connected to said first electrode of said first differentially connected electron control means and a control electrode forming said first control electrode of said differential amplified means and;

third electron control means having a control electrode connected to said second electrode of said second differentially connected electron control means, a first electrode connected to the first potential terminal, and a second electrode forming said output terminal of said differential amplifier means.

15. The oscillator circuit of claim 14 further including current source means having one terminal connected to said first electrodes of said first and second differentially connected electron control means means and a second terminal adapted to be connected to the second potential terminal.

16. The oscillator circuit of claim 15 wherein said differentially connected electron control means and said current source means include bipolar transistors of a first conductivity type having emitter, base and collector electrodes respectively corresponding to said first, control and second electrodes and said third electron control means includes a bipolar transistor of the second conductivity type.

* * * * *